(12) United States Patent
Tane et al.

(10) Patent No.: US 6,208,019 B1
(45) Date of Patent: Mar. 27, 2001

(54) ULTRA-THIN CARD-TYPE SEMICONDUCTOR DEVICE HAVING AN EMBREDDED SEMICONDUCTOR ELEMENT IN A SPACE PROVIDED THEREIN

(75) Inventors: Yasuo Tane, Tokyo; Kazuyasu Tanaka, Fuchu, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/265,924

(22) Filed: Mar. 10, 1999

(30) Foreign Application Priority Data

Mar. 13, 1998 (JP) .................................................. 10-063135

(51) Int. Cl.[7] .............................. H05K 1/18; H01L 23/30; H01L 23/00; H01L 23/34; G06K 19/07
(52) U.S. Cl. ......................... 257/679; 257/673; 257/680; 257/774; 257/792; 257/730; 235/492; 235/487; 361/761
(58) Field of Search .................................... 257/678, 674, 257/774, 680, 473, 679, 737, 738, 787, 704, 710, 730, 773, 792; 438/110; 361/398, 741, 408; 235/492, 487

(56) References Cited

U.S. PATENT DOCUMENTS

| | | | |
|---|---|---|---|
| 3,702,464 | * 11/1972 | Castrucci | 235/492 |
| 4,380,699 | * 4/1983 | Monnier et al. | 235/492 |
| 4,409,471 | * 10/1983 | Aigo | 235/492 |
| 4,447,716 | * 5/1984 | Aigo | 235/492 |
| 4,460,825 | * 7/1984 | Haghiri-Tehrani et al. | 29/827 |
| 4,474,292 | 10/1984 | Haghiri-Tehrani et al. | 206/329 |
| 4,649,418 | * 3/1987 | Uden | 174/52 FP |
| 4,709,254 | * 11/1987 | Haghiri-Tehrani et al. | 257/679 |
| 4,725,924 | * 2/1988 | Juan | 361/751 |
| 4,731,645 | * 3/1988 | Parmentier et al. | 257/679 |
| 4,792,843 | * 12/1988 | Haghari-Tehrani et al. | 257/679 |

(List continued on next page.)

Primary Examiner—Alexander O. Williams
(74) Attorney, Agent, or Firm—Oblon, Spivak, McClelland, Maier & Neustadt, P.C.

(57) ABSTRACT

A card-type semiconductor device including a thin (e.g., 30 to 70 $\mu$m) semiconductor chip which is thinner than an insulating resin film embedded in a device hole of a wiring film. The wiring film includes a copper wiring layer and inner leads arranged on one main face of the insulating resin film. Electrode pads are bonded to the inner leads by heating and pressing. A sealing resin layer is formed on the exterior of the bonded portion as required, and a polyester resin film is integrally laminated on the upper and lower faces of the wiring film. The card-type semiconductor device with the above construction has sufficient strength against bending, etc., and is suitable for integrated circuit (IC) card applications.

16 Claims, 3 Drawing Sheets

U.S. PATENT DOCUMENTS

| | | | |
|---|---|---|---|
| 4,843,225 | * | 6/1989 | Hoppe .................................. 235/492 |
| 4,907,061 | * | 3/1990 | Kohara ................................. 257/679 |
| 4,910,582 | * | 3/1990 | Miyamoto et al. ................... 257/667 |
| 4,931,853 | * | 6/1990 | Ohuchi et al. ....................... 257/679 |
| 5,013,900 | * | 5/1991 | Hoppe .................................. 235/492 |
| 5,048,179 | * | 9/1991 | Shindo et al. .......................... 29/840 |
| 5,067,008 | * | 11/1991 | Yanaka et al. ....................... 257/703 |
| 5,264,990 | * | 11/1993 | Venambre ............................ 361/741 |
| 5,272,374 | * | 12/1993 | Kodai et al. ......................... 257/679 |
| 5,280,192 | * | 1/1994 | Kiyzaninsky ........................ 257/723 |
| 5,324,687 | * | 6/1994 | Wojnorowski . |
| 5,327,010 | * | 7/1994 | Uenaka et al. ....................... 257/679 |
| 5,399,847 | * | 3/1995 | Droz ..................................... 235/488 |
| 5,480,842 | * | 1/1996 | Clifton et al. ....................... 257/679 |
| 5,612,403 | * | 3/1997 | Nguyen et al. ...................... 524/440 |
| 5,673,179 | * | 9/1997 | Horejs, Jr. et al. .................. 361/737 |
| 5,682,295 | * | 10/1997 | Horejs, Jr. et al. .................. 361/737 |
| 5,736,781 | * | 4/1998 | Atsumi ................................ 257/679 |
| 5,737,191 | * | 4/1998 | Horiuchi et al. ..................... 361/764 |
| 5,741,392 | * | 4/1998 | Droz ..................................... 156/295 |
| 5,773,775 | * | 6/1998 | Azoma ............................. 200/61.08 |
| 5,773,884 | * | 6/1998 | Andros et al. ....................... 257/707 |
| 5,777,381 | * | 7/1998 | Nishida ................................ 257/693 |
| 5,786,988 | * | 7/1998 | Harari .................................. 257/618 |
| 5,822,190 | * | 10/1998 | Iwasaki ................................ 361/737 |
| 5,822,191 | * | 10/1998 | Togusa et al. ....................... 361/751 |
| 5,851,854 | * | 12/1998 | Haghiri-Tehrani et al. ......... 438/118 |
| 5,856,913 | * | 1/1999 | Heilbronner ........................ 321/760 |
| 5,877,550 | * | 3/1999 | Suzuki ................................. 257/700 |
| 5,880,934 | * | 3/1999 | Haghiri-Tehrani .................. 361/737 |
| 5,917,705 | * | 6/1999 | Kirschbauer et al. ............... 361/737 |
| 6,027,958 | * | 2/2000 | Vu et al. .............................. 438/110 |

* cited by examiner

ULTRA-THIN CARD-TYPE SEMICONDUCTOR DEVICE HAVING AN EMBREDDED SEMICONDUCTOR ELEMENT IN A SPACE PROVIDED THEREIN

BACKGROUND OF THE INVENTION

1. Field of the Invention

The present invention relates to a card-type semiconductor device such as an IC card.

2. Description of the Related Art

Card-type semiconductor devices with a semiconductor chip built in, called IC card, are being developed actively these years.

An example of the structure of such a card-type semiconductor device is shown in FIG. 5. Reference numeral 21 denotes a wiring substrate, which has a desired wiring layer formed on one side (the upper face in the drawing) of an insulating substrate and a wiring layer to be an external connection terminal on the other side (the lower face in the drawing). Both wiring layers are electrically connected through conductive holes (not shown). A semiconductor chip 22 is mounted onto the upper face of the wiring substrate 21 with an insulating adhesive agent (mounting agent) 23, and its electrode pads are connected to the wiring layer of the wiring substrate 21 by bonding wires 24 such as gold wires. And a mold resin layer 25 of epoxy resin layer or the like is formed on the exterior of the wire-bonded portion. The resin-molded chip-mounted section is fitted into a recess of an exterior sheet 26 made of polyvinyl chloride resin, polyester resin or the like, and the wiring layer on the lower face of the wiring substrate 21 is exposed as external connection terminal.

Such a conventional card-type semiconductor device, however, could not be fabricated to have a satisfactory small thinness because the semiconductor chip 22 has a large thickness of 350 to 450 $\mu$m and defines an overall thickness of the device.

The IC card is required to have a strength enough to resist against an impact, bending, twisting, etc. due to an external force. But the card-type semiconductor device, which has the above-described thick semiconductor chip 22 mounted, could not meet the requirement in terms of a bending strength and the like.

SUMMARY OF THE INVENTION

The present invention was achieved to remedy the problems described above. And it is an object of the invention to provide a card-type semiconductor device, which is thin with a sufficient strength against bending, twisting and the like and suitable as an IC card.

This invention is disclosed in Japanese Patent Application No. 10-063135 filed on Mar. 13, 1998, and the entire disclosure thereof is incorporated herein by reference.

A first aspect of the present invention is a card-type semiconductor device, which comprises:

a film insulating substrate having a device hole; a wiring layer formed on at least one main face of the insulating substrate and a group of leads whose one end is connected to the wiring layer and the other end is protruded into the device hole; a semiconductor element which has a thickness smaller than the insulating substrate with its each electrode pad electrically connected to respective leading ends of the group of leads; and an exterior layer which is laminated on both faces of the insulating substrate, wherein the semiconductor element is fully embedded into the device hole of the insulating substrate.

A second aspect of the present invention is a card-type semiconductor device, which comprises a semiconductor element and an enclosure portion made of an insulating resin for fully covering the periphery of the semiconductor element without remaining any gap; wherein the semiconductor element has a flexible bending radius of 15 to 40 mm, and the enclosure portion has a bending radius of less than 15 mm; and the semiconductor device as a whole has a flexible bending radius of 15 to 40 mm.

According to the invention, the film insulating substrate can be an insulating resin film such as a polyimide resin film (trade name: UPILEX manufactured by Ube Industries, Ltd.). The film preferably has a thickness of 75 to 125 $\mu$m. It is also preferable that the device hole formed in the insulating resin film has such a size and a plane shape to correspond with those of the semiconductor element to be described afterward, so that the semiconductor element is embedded with a sufficient allowance around it.

The wiring layer formed on at least one main face of the film insulating substrate and the group of leads whose one end connected to the wiring layer are formed of Cu, a Cu-based alloy or the like by deposition patterning of such metal on the insulating substrate or photo-etching of a Cu foil or the like, which is directly laminated on the insulating substrate or with an adhesive agent layer such as an epoxy-based layer or the like between them.

In the card-type semiconductor device according to the invention, the end (leading end) of the group of leads protruded into the device hole is bonded (inner lead bonding) to the electrode pads, made of aluminum or the like, of the semiconductor element by heating and pressing. It is desirable that the leading ends of the leads are coated with a gold, tin or solder layer by plating or the like in order to improve their bonding strength. The electrode pads of the semiconductor element may be bonded to the leads through the gold bumps formed on the electrode pads. The bonding strength can be further improved by bonding the leads, which are plated with gold, tin or the like, to the gold bumps formed on the electrode pads.

For the bonding portions between the leads and the electrode pads of the semiconductor element, it is preferable that the leading ends of the leads have a width smaller than that of the electrode pads or that of the gold bumps formed on the electrode pads. By fabricating as described above, a protective film (passivation film) of the semiconductor element can be effectively prevented from being damaged through a contact with the leading ends of leads.

The invention can use an insulating resin film having flexibility, such as a polyester resin film, as the exterior layer. This insulating resin film is laminated on both faces of the film substrate (wiring film), on which the above-described wiring layer or the like is formed, by thermal fusion bonding for example. The film is not limited to have a particular thickness but preferably has a thickness of about 50 $\mu$m (25 to 75 $\mu$m) so to protect as an enclosure its inside and also to contribute in making the device thinner as a whole.

According to the present invention, the semiconductor element is preferably a thin semiconductor element having each side of 3 to 6 mm and a thickness of 30 to 70 $\mu$m which is thinner than the film insulating substrate so that it can be fully embedded in the device hole of the above-described film insulating substrate.

By using the semiconductor element having a thickness in the above-described range (30 to 70 $\mu$m), the card-type semiconductor device having a bending radius to allow repeated bending (hereinafter referred to as the bending radius) of 15 to 40 mm can be realized.

Strength against bending which is required for the card-type semiconductor device such as the IC card is not standardized yet. But it is expected that the card-type semiconductor device has such a very high bending strength corresponding to that of the conventional Japanese magnetic telephone card that its appearance and function are not affected even after repeatedly applying strong bending (e.g., a bending radius of about 166 mm on the long side) for about 1000 times.

The semiconductor element having a thickness of 30 to 70 $\mu$m has a bending radius of about 17 to 33 mm though it is slightly variable depending on a grinding direction and a very high bending strength as large as 7 times or more as compared with a conventionally used semiconductor element having a thickness of 350 to 450 $\mu$m (a bending radius of about 200 mm). Thus, a necessary and sufficient bending strength for the IC card can be realized for the first time by using the semiconductor element having a thickness of 30 to 70 $\mu$m. The semiconductor element having a thickness of less than 30 $\mu$m is not processed with ease, the yield of its manufacture is not good, and its strength against bending and the like is low.

According to the invention, the above-described thin semiconductor element is preferably not fixed to the exterior layer laminated on the upper and lower faces of the wiring film. By arranging the semiconductor element in the device hole in the state free from the exterior layer, its strength against bending can be improved, and in the semiconductor device the bonded portions between the semiconductor element and the leads are not easily broken.

According to the second aspect of the invention, the enclosure portion made of an insulating resin is also required to have the same or smaller bending radius as the above-described semiconductor element. The polyimide resin film used as the film insulating substrate and the polyester resin film used as the exterior layer have good flexibility, a much smaller bending radius than 15 mm and a mechanical strength sufficient to protect the semiconductor element from an external pressure. Since such films are used to configure the enclosure portion, the card-type semiconductor device having a bending radius of 15 to 40 mm can be obtained.

Accordingly, the card-type semiconductor device according to the invention can be made to have a very small thickness of 200 $\mu$m or below as a whole because the very thin semiconductor element which is thinner than the film insulating substrate is fully embedded in the device hole of the insulating substrate. Besides its strength against bending, twisting, local striking/pushing and the like is highly improved as compared with a conventional card-type semiconductor device. When the semiconductor device according to the invention is used as the IC card, it can fully meet a very high bending strength required. In an inner lead bonding (ILB) process, bonding work can be made efficiently without paying attention to an edge touch of the inner leads to the semiconductor element. Thus, productivity is high, and a yield is improved.

A more complete appreciation of the invention and many of the attendant advantages thereof will be readily obtained as the same becomes better understood by reference to the following detailed description when considered in connection with the acccompanying drawings, wherein:

DETAILED DESCRIPTION OF THE PREFERRED EMBODIMENTS

Figure 1:
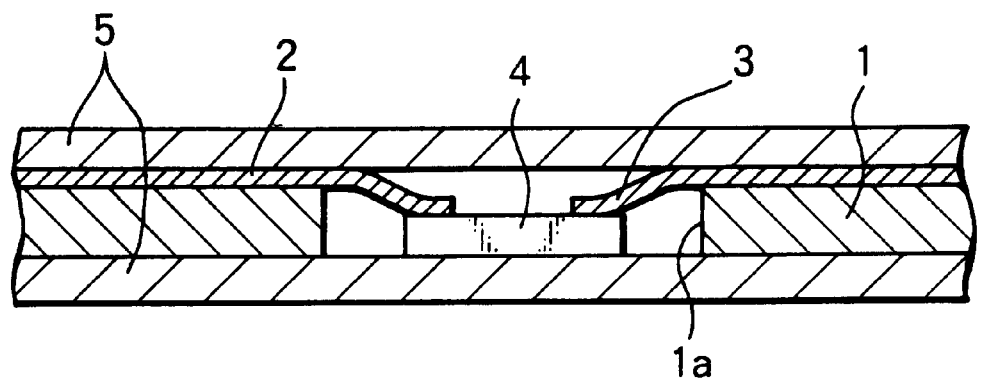
FIG. 1 is a sectional diagram showing main portions of a first embodiment of a card-type semiconductor device according to the invention.

Referring now to the drawings, wherein like reference numerals designate identical or corresponding parts throughout the several views, and more particularly to FIGS. 1 to 4 thereof, there are illustrated embodiments of the present invention as will be further described.

Embodiment 1

FIG. 1 is a diagram showing a cross section of main portions of a first embodiment of a card-type semiconductor device according to the invention.

In FIG. 1, reference numeral 1 denotes an insulating resin film (e.g., polyimide resin film) with a thickness of 75 to 125 $\mu$m, which has a device hole 1a at the center. A wiring layer 2 is formed on one face of the insulating resin film 1 by, for example, photo-etching a copper foil which is adhered to the film with an adhesive layer (not shown) between them. Ends of the wiring layer 2 are protruded into the device hole 1a to form inner leads 3. Leading tips of the inner leads 3 are plated with gold or the like (not shown) in order to facilitate the connection with the electrode pads.

A semiconductor chip 4 having each side of 3 to 6 mm and a thickness smaller than that of the insulating resin film 1 is mounted on the wiring film as follows. Specifically, the semiconductor chip 4, whose each side is smaller than the corresponding side of the device hole 1a and thickness is 30 to 70 $\mu$m, is embedded with a face up into the device hole 1a, and each electrode pad (not shown) of the semiconductor chip 4 is bonded to the inner leads 3 by ILB(inner lead bonding).

Besides, a polyester resin film 5 having a thickness of about 50 $\mu$m is laminated as an exterior layer on both faces of the wiring film by fusion bonding. This card-type semiconductor device has a coil-shaped antenna made of wiring for transmitting/receiving data to make reading and writing of data with an external processing device by radio (contactless). This portion is omitted from being shown in the drawing.

The card-type semiconductor device of the first embodiment configured as described above has the thin semiconductor chip 4 with a thickness of 30 to 70 $\mu$m, which is thinner than the insulating resin film 1, fully embedded into the device hole 1a of the insulating resin film 1. The polyester resin film 5, which has a thickness of about 50 $\mu$m and flexibility, is integrally laminated on the upper and lower faces of the insulating resin film. Therefore, this card-type semiconductor device has a very small total thickness and can fulfill the requirement for a thickness of the IC card with sufficient allowance. It also has a small bending radius of 15 to 40 mm allowing repeated bending and a high strength against bending, twisting, striking/pushing and the like.

Since the thin semiconductor chip 4 is mounted in a free independent state within the device hole 1a without being fixed to the polyester resin film 5, which is formed on the upper and lower faces of the insulating resin film, a bending strength of the connected portion between the semiconductor chip 4 and the inner leads 3 is high, so that a connection failure occurs very seldom. The semiconductor chip 4 can be mounted simply by connecting it to the inner leads 3 and fitting into the device hole 1a and does not need its positioning.

Since the semiconductor chip 4 of the first embodiment is thinner than the insulating resin film 1, the ILB processing of the semiconductor chip 4 can be effected efficiently.

Figure 2:
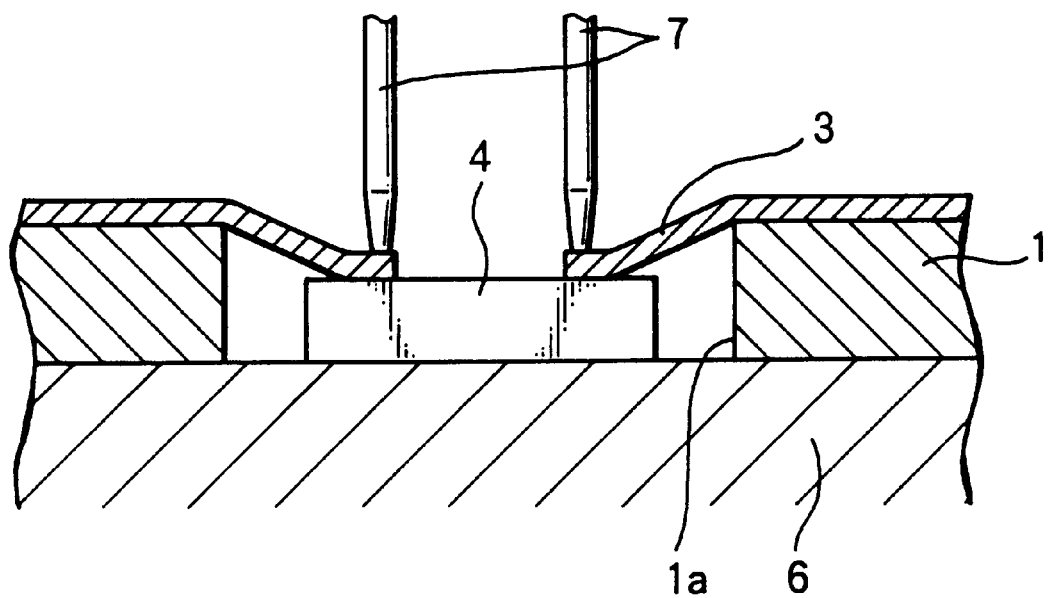
FIG. 2 is a diagram schematically showing an ILB process for fabricating the card-type semiconductor device of the first embodiment.

Specifically, the ILB process conventionally adopts a method by which the wiring film is set at a position higher than the semiconductor chip and the inner leads extended from the high position is connected to the electrode pads of the semiconductor chip in order to prevent the inner leads from making an edge touch to the semiconductor chip. But, as to the semiconductor device of the first embodiment, the wiring film and the semiconductor chip 4 are placed on one and same stage 6, and thermosonic bonding by a bonding tool 7 can be effected efficiently by applying ultrasonic waves without caring about the edge touch of the inner leads 3 to the semiconductor chip 4 as shown in FIG. 2.

When the inner leads 3 are bonded to the electrode pads, downward forming of the leads is simultaneously effected automatically and stably, so that the semiconductor device obtained has a higher bending strength. Furthermore, in the ILB performed on the same stage 6, the back face (the face opposite from the electrode-formed face) of the semiconductor chip 4 and the back face of the wiring film are arranged at the same height, so that fusion bonding of the polyester resin film 5 to both faces of the wiring film by heating is made with ease.

Embodiment 2

Figure 3:
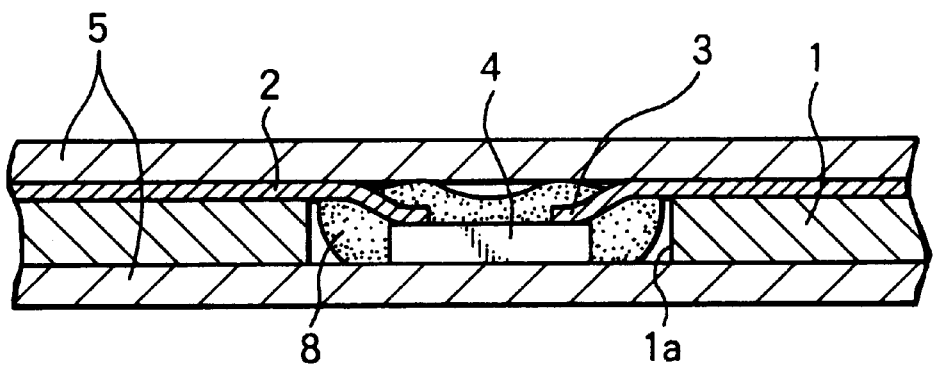
FIG. 3 is a sectional diagram showing main portions of a second embodiment of a card-type semiconductor device according to the invention.

FIG. 3 is a diagram showing a cross section of main components of a second embodiment of the card-type semiconductor device according to the invention.

In the card-type semiconductor device of the second embodiment, a sealing resin layer 8 is formed by potting on the electrode pad-formed face of the semiconductor chip 4 embedded in the device hole 1a and the exterior of the bonded portion between the electrode pads and the inner leads 3. A material for the sealing resin layer 8 may be epoxy resin, silicone resin or the like. Especially, when the silicone resin is used, water-vapor resistance of the semiconductor chip 4 is improved, and the semiconductor device obtained has a smaller bending radius than one obtained using the epoxy resin. In this embodiment, since other portions of the semiconductor device are configured in the same way as in the first embodiment, the same reference numerals as in FIG. 1 are allotted and their description is not repeated.

In the card-type semiconductor device of the second embodiment configured as described above, the thin (a thickness of 30 to 70 μm) semiconductor chip 4 is fully embedded in the device hole 1a of an insulating resin film 1, and a thin, flexible polyester resin film 5 is integrally laminated on upper and lower faces of the insulting resin film 1 in the same way as in the first embodiment. Therefore, the semiconductor device has a very small overall thickness and can meet the requirements for the IC card. Besides, the semiconductor device has a small bending radius of 15 to 40 mm and a high strength against bending, twisting, striking/pushing and the like.

Moisture resistance of the semiconductor chip 4 is improved because the resin-sealing layer 8 is formed on the exterior of the bonded portion and the like of the semiconductor chip 4. Since the sealing resin layer 8 is made of the silicone resin, good flexural properties (smallness of a bending radius) of the semiconductor chip 4 and enclosure portions (the insulating resin film 1 and the polyester resin film 5) are not deteriorated.

Figure 4:
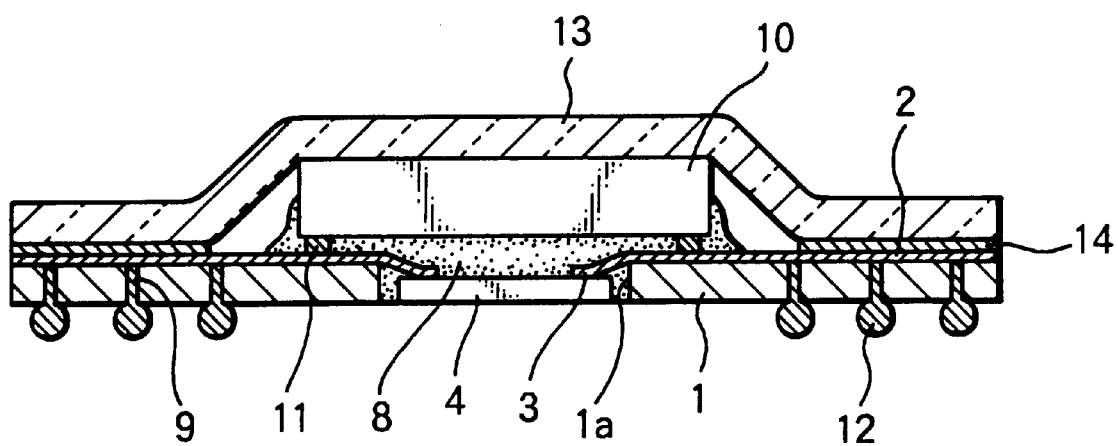
FIG. 4 is a sectional diagram showing another structure of the semiconductor device having a thin semiconductor chip used in the first and second embodiments according to the invention.
Figure 5:
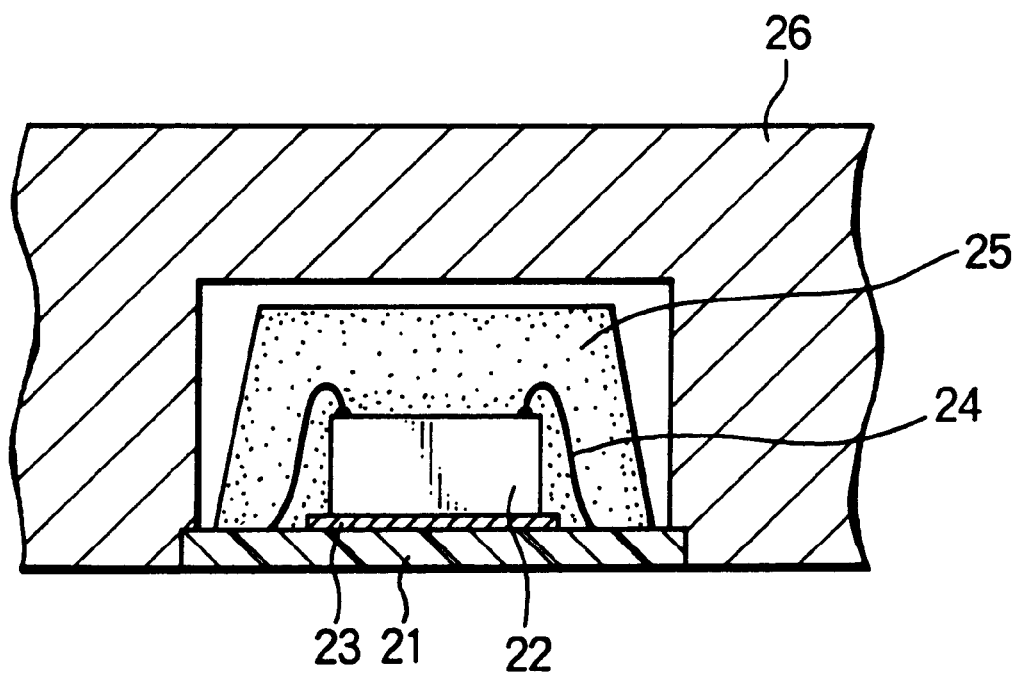
FIG. 5 is a sectional diagram showing an example structure of a conventional card-type semiconductor device.

The thin semiconductor device, which has a semiconductor chip having each side of 3 to 6 mm long and a thickness of 30 to 70 μm smaller than that of an ordinary insulating resin film mounted in the device hole, may have another semiconductor chip which is mounted to cover at least a part of the opening of the device hole as shown in FIG. 4.

Specifically, in this semiconductor device, the wiring layer 2 is formed by photo-etching a copper foil on one main face of the insulating resin film (e.g., polyimide resin film) having a thickness of 75 to 125 μm and a device hole 1a, and holes 9 are also formed to electrically connect the wiring layer 2 to the opposite face. The ends of the wiring layer 2 are protruded as the inner leads 3 into the device hole 1a.

The first thin semiconductor chip 4, which has each side length smaller than the corresponding side of the device hole 1a and a thickness of 30 to 70 μm which is smaller than that of the insulating resin film 1, is embedded with a face up within the device hole 1a of the wiring film, and its electrode pads are bonded to the inner leads 3 of the wiring film by thermosonic bonding.

A second semiconductor chip 10 is mounted above the first thin semiconductor chip 4 connected as described above with an appropriate space held between them. Specifically, the second semiconductor chip 10, which has a thickness larger than that of the insulating resin film 1 and each side larger than the corresponding side of the device hole 1a, is disposed with a face down to cover the opening of the device hole 1a, and the electrode pads and the wiring layer 2 on the upper face of the wiring film are flip-chip bonded through solder bumps 11 or gold bumps. The sealing resin layer 8 of epoxy resin or the like is formed in the space between the upper and lower semiconductor chips mounted as described above.

Solder balls 12 as external connection terminals are formed on the lower face of the wiring film and electrically connected to the wiring layer 2 on the upper face of the wiring film through the via holes. A cover plate 13 having a shape retaining property is adhered to the wiring layer 2 on the upper face of the film and the upper semiconductor chip 10 with an adhesive layer 14

In the semiconductor device configured as described above, the first and second semiconductor chips 4, 10 which are overlaid vertically are mounted, so that the increase of pads for connecting the bumps and the decrease of the pad pitch due to the increase of chips can be complied with, and the semiconductor device obtained having the semiconductor chips mounted at a high density is obtained. Especially, since the first (lower) semiconductor chip 4 has a thickness of 30 to 70 μm which is thinner than the insulating resin film 1 and is fully embedded in the device hole 1a, the semiconductor device as a whole can be kept to have the same thickness as a semiconductor device which has only one ordinary semiconductor chip mounted. Furthermore, this semiconductor device is suitable for high-frequency equipment because a wiring length is made short.

As apparent from the above description, the card-type semiconductor device according to the invention can be made to have a very small thickness as a whole because the very thin semiconductor element, which is thinner than the film insulating substrate, is fully embedded into the device hole of the insulating substrate. Besides, it has a sufficient strength against bending, twisting, local striking/pushing and the like and is suitable as the IC card. The semiconductor element can be mounted in the semiconductor device with good workability.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A semiconductor device, comprising:
    a film insulating substrate having a device hole;
    a wiring layer formed on at least one main face of the insulating substrate and a group of leads whose one end is connected to the wiring layer and the other end is protruded into the device hole;
    a semiconductor element which has a thickness smaller than the insulating substrate with its each electrode pad electrically connected to respective leading ends of the group of leads, the semiconductor element being fully embedded into the device hole of the insulating substrate;
    exterior layers which are laminated on both faces of the insulating substrate; and
    an insulating resin layer sealing the connected portions between the electrode pads of the semiconductor element and the leads,
    wherein the insulating resin layer is formed in such a manner that at least a part of a side surface of the semiconductor element is covered, and
    a first air portion is formed between the insulating resin layer and the insulating substrate in the device hole thereof.

2. The semiconductor device according to claim 1, wherein the semiconductor element has a thickness of 30 to 70 μm.

3. The semiconductor device according to claim 1, wherein the semiconductor element is not fixed to but free from the exterior layer and disposed within the device hole.

4. The semiconductor device according to claim 1, wherein the film insulating substrate is a polyimide resin film.

5. The semiconductor device according to claim 1, wherein at least one of the exterior layers is a polyester resin film.

6. The semiconductor device according to claim 1, wherein a second air portion is formed between one of the exterior layers and the insulating resin layer and disposed in the device hole on an electrode pad-formed surface of the semiconductor element.

7. The semiconductor device according to claim 1, wherein the leading ends of the leads are coated with a gold, tin or solder layer, which is bonded with the electrode pads of the semiconductor element.

8. The semiconductor device according to claim 1, wherein each leading end of the leads has a width smaller than that of the electrode pads of the semiconductor element.

9. The semiconductor device according to claim 1, wherein the electrode pads of the semiconductor element are bonded with the leads through gold bumps.

10. The semiconductor device according to claim 9, wherein each leading end of the leads has a width smaller than that of the gold bumps.

11. A semiconductor device comprising:
    a semiconductor element having a thickness of 30 to 70 μm and a flexible bending radius of 15 to 40 mm: and
    an enclosure portion made of an insulating resin for fully covering the periphery of the semiconductor element,
    wherein the enclosure portion has a bending radius of less than 15 mm, and
    the semiconductor device as a whole has a flexible bending radius of 15 to 40 mm.

12. The semiconductor device according to claim 11, wherein the enclosure portion comprises a film insulating substrate having a device hole and exterior layers which are laminated on both faces of the insulating substrate.

13. The semiconductor device according to claim 12, wherein the semiconductor element is not fixed to but free from the exterior layers and disposed within the device hole.

14. The semiconductor device according to claim 12, wherein the film insulating substrate is a polyimide resin film.

15. The semiconductor device according to claim 12, wherein at least one of the exterior layers is a polyester resin film.

16. The semiconductor device according to claim 12, wherein the insulating resin layer sealing the connected portions between electrode pads of the semiconductor element and leads are formed in such a manner that at least a part of a side surface of the semiconductor element is covered, and
    an air portion is formed between the insulating resin layer and the insulating substrate in the device hole thereof.

* * * * *